United States Patent [19]

Crosher

[11] 4,055,442
[45] Oct. 25, 1977

[54] SILICON SOLAR CELL CONSTRUCTION HAVING TWO LAYER ANTI-REFLECTION COATING

[75] Inventor: Frederick K. Crosher, Santa Rosa, Calif.

[73] Assignee: Optical Coating Laboratory, Inc., Santa Rosa, Calif.

[21] Appl. No.: 650,258

[22] Filed: Jan. 19, 1976

[51] Int. Cl.² .............................................. H01L 31/06
[52] U.S. Cl. ................................................ 136/89 CC
[58] Field of Search ................................... 136/89 CC

[56] References Cited

U.S. PATENT DOCUMENTS 3,539,883  11/1970  Harrison ........................... 136/89 X

OTHER PUBLICATIONS

J. P. Schwartz, "Improved Silicon Solar Cell Antireflective Coatings", Conf. Record, IEEE Photospecialists Conf, Aug. 1970, pp. 173-175.
E. Y. Wang et al., "Optimum Design of Antireflection Coatings for Silicon Solar Cells", Conf. Record, 10th IEEE Photospecialists Conf, Nov. 1973, pp. 168-173.
A. Musset et al., Chapter 4 in "Progress In Optics", North Holl and Pub. Co. 1970, pp. 203-206, 210-214, 236, 237.
H. J. Hovel et al., "Method For Si & GaAs Solar Cell Diffusion", IBM Tech. Disc. Bulletin, vol. 16, Dec. 1973, pp. 2083-2084.
H. J. Hovel, "Semiconductors & Semimetals, vol. 11 - Solar Cells", Academic Press, N. Y. (1975), pp. 203-207, 245.

Primary Examiner—John H. Mack
Assistant Examiner—Aaron Weisstuch
Attorney, Agent, or Firm—Flehr, Hohbach, Test, Albritton & Herbert

[57] ABSTRACT

Silicon solar cell construction having a two layer anti-reflection coating overlying the silicon cell and being disposed between the silicon solar cell and the cement which is utilized for securing the silicon solar cell cover to the silicon solar cell.

3 Claims, 2 Drawing Figures

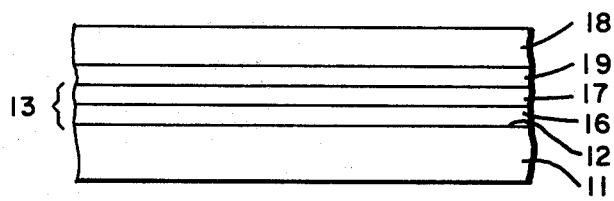
FIG.—1
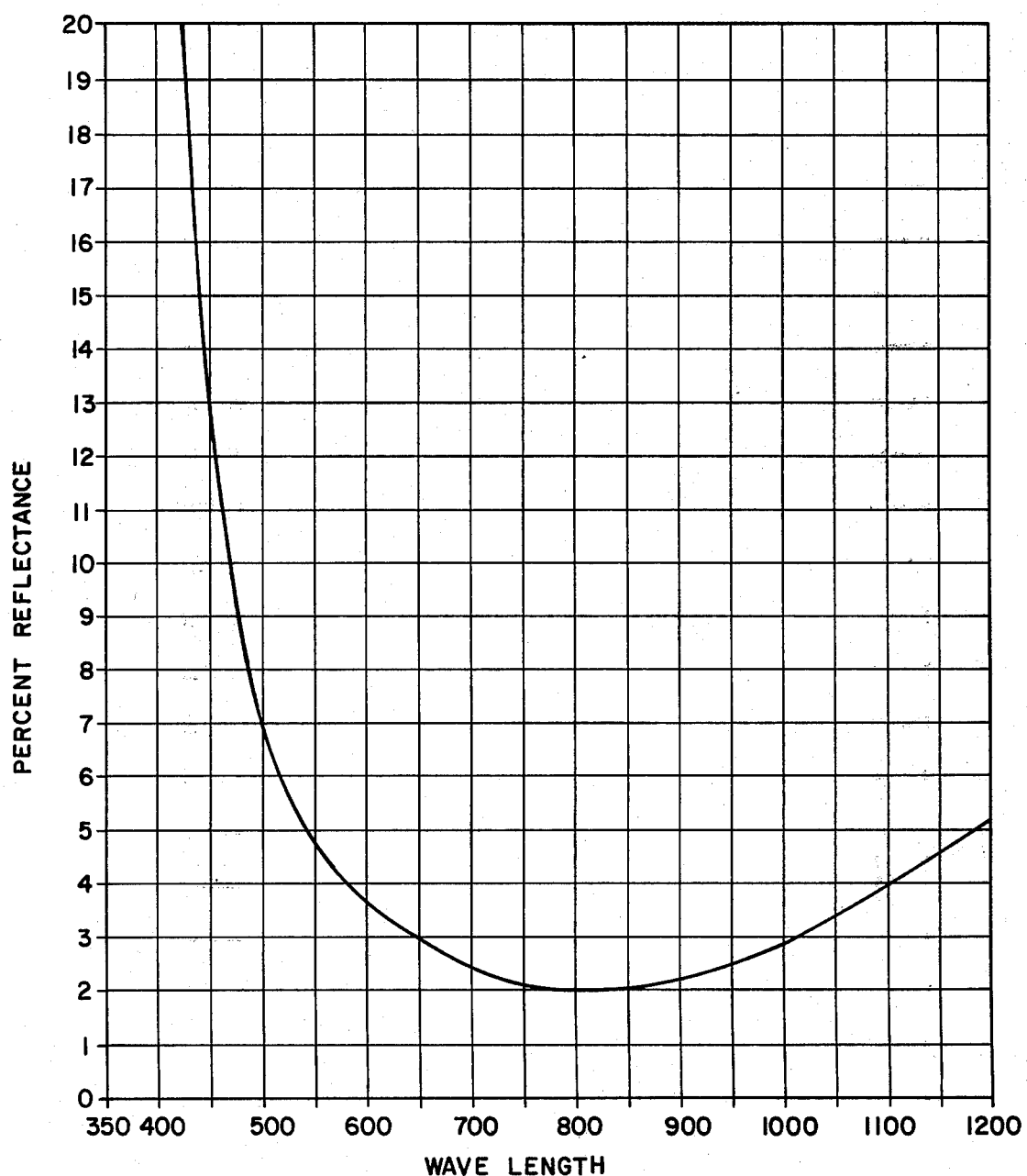
FIG.—2

SILICON SOLAR CELL CONSTRUCTION HAVING TWO LAYER ANTI-REFLECTION COATING

BACKGROUND OF THE INVENTION

Silicon solar cells have been available for a relatively long period of time. In order to increase the output from such solar cells it has been conventional to provide a single layer anti-reflection coating overlaying the solar cell. Typically these single layer anti-reflection coatings have been formed of silicon monoxide, a titanium oxide such as titanium dioxide or gas reacted titanium monoxide as well as tantalum pentoxide. Since the tantalum pentoxide and the titanium oxide have an index of refraction which is greater than that of silicon monoxide, they form a better anti-reflection coating between the silicon solar cell and the glass cover which conventionally covers such a solar cell. It has been found, however, that these single layer anti-reflection coatings suffer from a common difficulty in that they exhibit a band width which does not sufficiently cover the spectral region from 400 - 1200 nanometers which corresponds to the silicon solar cell response characteristic.

SUMMARY OF THE INVENTION AND OBJECTS

The silicon solar cell construction consists of a body formed essentially of silicon and having a surface with a photovoltaic junction formed thereon. First and second layers are formed on the surface of the solar cell and serve to provide an anti-reflection coating which is effective within the spectral range of 400 to 1200 nanometers. A glass solar cell cover is provided which is secured to the body having the first and second layers thereon by a cement. The first layer is, counting from the body, formed of material that has an index of refraction which is less than that of the body and which is greater than that of the glass cover. The second layer is formed of a material that has an index of refraction which is greater than that of the glass cover but which is less than that of the first layer.

In general, it is an object of the present invention to provide a solar cell construction having a two layer anti-reflection coating which is effective in the spectral range of 400 to 1200 nanometers.

Another object of the invention is to provide a solar cell construction of the above character which has increased efficiency.

Another object of the invention is to provide a solar cell construction of the above character which has increased power output capabilities.

Additional objects and features of the invention will appear from the following description in which the preferred embodiment is set forth in detail in conjunction with the accompanying drawing.

BRIEF DESCRIPTION OF THE DRAWING

FIG. 1 is a cross-sectional view of a solar cell construction incorporating the present invention.

FIG. 2 is a graph showing the theoretical spectral performance of the two layer anti-reflection coating utilized in the solar cell construction.

DESCRIPTION OF THE PREFERRED EMBODIMENT

A cross-sectional view of the silicon solar cell construction incorporating the present invention is shown in FIG. 1. As shown therein it consists of a body 11 formed essentially of silicon having an index of refraction of approximately 4 and which is provided with a generally planar surface 12 that has a photovoltaic junction (not shown) formed thereon in a conventional manner. After the silicon solar cell has been fabricated, an anti-reflection coating 13 of the present invention having first and second layers 16 and 17 is deposited on the surface 12. After the anti-reflection coating has been deposited, a conventional solar cell cover 18 having an index of refraction of approximately 1.45 is secured to the anti-reflection coated cell by the use of a layer of cement 19 which secures the cover to the anti-reflection coating. The layer of cement 19 which is utilized for securing the solar cell cover 18 to the anti-reflection coating 13 typically has an index of refraction of approximately 1.4.

It is desirable that the anti-reflection coating 13 be substantially achromatic throughout the spectral region of interest which corresponds to the response characteristic of the solar cell which is in the vicinity of 400 nanometers to 1200 nanometers.

The first layer 16 of the anti-reflection coating 13 is formed of a material having an index of refraction which is less than that of the body 11 and which is greater than that of the glass cover 18. By way of example, the first layer is formed of a titanium oxide which has a higher index of refraction of approximately 2.35 to 2.4. It can be formed of a gas reacted titanium oxide as taught in the Auwater patent Re. 26,857. Also if desired, it can be formed from the evaporation of titanium sesquioxide $Ti_2O_3$ or titanium dioxide $TiO_2$ (rutile). The titanium oxide layer 16 is deposited to a thickness of one quarter wave length at a 600 nanometer design wave length. The second layer 17 is then deposited on the layer 16. The material which is utilized for the second layer has a layer index of refraction of approximately 1.6 to 1.7 which is less than that of the material for the layer 16 and which is greater than that of the cement 19. It has been found that aluminum oxide ($Al_2O_3$) forms a satisfactory second layer. It is deposited to the thickness of one quarter wave length at the 600 nanometer design wave lengths and has an index of refraction in the vicinity of 1.65.

Both the layers 16 and 17 are deposited in a conventional manner and are deposited while the substrate 11 is relatively hot (in the vicinity of 200° C). They are deposited by conventional evaporation techniques in a vacuum chamber.

After the anti-reflection coating 13 has been formed, the solar cell cover 18 is cemented to the anti-reflection coating by a layer of cement 19 in a conventional manner.

In FIG. 2 there is shown a graph of the theoretical spectral performance of the two layer anti-reflection coating 13 shown in FIG. 1 assuming that the cell has been immersed in a medium having an index of refraction of 1.4 corresponding to the index of refraction of the cement layer 19. The plot which is shown in FIG. 2 is from 350 to 1200 nanometers corresponding to the region of interest for the solar cell and for 0 to 20% reflectance. Absorption is calculated as 1 minus the reflectance (1-R). As can be seen, the anti-reflection coating has a substantial effect on the reflectivity and that the reflectivity is less than 3% for the range of 650 to over 1,000 nanometers and on average is substantially less than 4% for the overall range of approximately 425 to 1100 nanometers.

It has been found that the response of the anti-reflection curve is less V-shaped and more rounded for the present anti-reflection coating and covers a much larger spectral region than the conventional generally V-shaped curve which is obtained with single layer anti-reflection coatings heretofore utilized in solar cells. It also has been found that when the response of a solar cell utilizing the two layer coating of the present invention is integrated against the AMO (air mass zero) solar distribution and the cell response, an improvement in the vicinity of 1.5 to 2.5% is obtained over a conventional single layer anti-reflection coating. Even though this percentage increase is relatively small, it is quite important particularly in view of the fact that the solar cell is utilized in spacecraft where weight is a very important consideration. Therefore, with the same solar cell construction utilizing an anti-reflection coating of the present invention, an increased power output ranging from 1.5 to 2.5% can be obtained or conversely for the same power output the weight of the solar cell can be decreased by approximately 1.50 to 2.5%.

In the present invention, it can be seen that the anti-reflection coating which is utilized has one layer which is formed of material having a high index of refraction and which is non-absorbing in the region of 400 nanometers to 1200 nanometers. As pointed out above, titanium oxide satisfies this requirement. However, any material which has an index of refraction of greater than approximately 2.35 can be utilized. The other layer is formed of a low index material and should have an index of refraction in the vicinity of 1.6 to 1.7. As pointed out above, aluminum oxide satisfies this requirement. Gas reacted silicon monoxide also could be utilized because it has an index of refraction in the vicinity of 1.6.

The anti-reflection coating in the present invention increases solar absorption by matching the high index silicon to the lower index cement which is utilized for attaching the cover to the solar cell.

From the curve which is shown in FIG. 2, it can be seen that the anti-reflection coating does not provide zero reflectance: However, it does provide greatly reduced reflectance with presently known materials.

What is claimed is:

1. In a silicon solar cell construction, a body formed essentially of silicon having a surface with a photovoltaic junction applied thereon, an anti-reflection coating formed on said surface, a transparent protective cover and a layer of substantially transparent cement securing said protective cover to said anti-reflection coating and to said body, said cover and said cement having indices of refraction of approximately 1.45, and approximately 1.4, respectively, said anti-reflection coating being formed of first and second layers, said first layer being formed of material having a high index of refraction which is less than that of silicon ranging from 2.35 to 2.4 and being closer to said silicon body than said second layer said second layer being formed of a material having a low index of refraction which is greater than that of the cement but less than that of said first layer ranging from 1.6 to 1.7.

2. A silicon solar cell construction as in claim 1 wherein said high index material is an oxide of titanium and wherein said low index material is an oxide of aluminum.

3. A solar cell construction as in claim 2 wherein said anti-reflection coating has a reflectivity of less than 3% in the range of 650 nanometers to 1,000 nanometers.

* * * * *